United States Patent
Sporre et al.

(10) Patent No.: US 10,600,868 B2
(45) Date of Patent: Mar. 24, 2020

(54) FINFET GATE CUT AFTER DUMMY GATE REMOVAL

(71) Applicant: TESSERA, INC., San Jose, CA (US)

(72) Inventors: John R. Sporre, Albany, NY (US); Siva Kanakasabapathy, Pleasanton, CA (US); Andrew M. Greene, Albany, NY (US); Jeffrey Shearer, Albany, NY (US); Nicole A. Saulnier, Albany, NY (US)

(73) Assignee: Tessera, Inc., San Jose, CA (US)

(*) Notice: Subject to any disclaimer, the term of this patent is extended or adjusted under 35 U.S.C. 154(b) by 0 days.

(21) Appl. No.: 16/244,493

(22) Filed: Jan. 10, 2019

(65) Prior Publication Data

US 2019/0189517 A1    Jun. 20, 2019

Related U.S. Application Data

(62) Division of application No. 15/841,933, filed on Dec. 14, 2017, now Pat. No. 10,229,854.

(51) Int. Cl.
| | |
|---|---|
| *H01L 29/10* | (2006.01) |
| *H01L 25/065* | (2006.01) |
| *H01L 29/78* | (2006.01) |
| *H01L 21/8234* | (2006.01) |
| *H01L 21/02* | (2006.01) |
| *H01L 29/66* | (2006.01) |
| *H01L 27/088* | (2006.01) |
| *H01L 21/8238* | (2006.01) |

(Continued)

(52) U.S. Cl.
CPC .... *H01L 29/1033* (2013.01); *H01L 21/02019* (2013.01); *H01L 21/82345* (2013.01); *H01L 21/823431* (2013.01); *H01L 21/823437* (2013.01); *H01L 21/823462* (2013.01); *H01L 21/823481* (2013.01); *H01L 21/823828* (2013.01); *H01L 21/823842* (2013.01); *H01L 25/0657* (2013.01); *H01L 27/0886* (2013.01); *H01L 27/0924* (2013.01); *H01L 29/41791* (2013.01); *H01L 29/66545* (2013.01); *H01L 29/66795* (2013.01); *H01L 29/785* (2013.01); *H01L 29/7831* (2013.01)

(58) Field of Classification Search
CPC ......... H01L 21/76838; H01L 21/76843; H01L 21/76877; H01L 21/7688; H01L 21/823437; H01L 21/823462; H01L 21/823828; H01L 27/088; H01L 29/1033; H01L 29/1079; H01L 29/42312; H01L 29/78
See application file for complete search history.

(56) References Cited

U.S. PATENT DOCUMENTS

| | | |
|---|---|---|
| 8,367,556 B1 | 2/2013 | Fuller et al. |
| 8,377,795 B2 | 2/2013 | Kanakasabapathy et al. |

(Continued)

OTHER PUBLICATIONS

List of IBM Patents or Patent Applications Treated as Related dated Jan. 10, 2019, 2 pages.

*Primary Examiner* — Eduardo A Rodela

(57) ABSTRACT

Semiconductor devices include a first semiconductor fin. A first gate stack is formed over the first semiconductor fin. Source and drain regions are formed on respective sides of the first gate stack. An interlayer dielectric is formed around the first gate stack. A gate cut plug is formed from a dielectric material at an end of the first gate stack.

19 Claims, 6 Drawing Sheets

(51) Int. Cl.
*H01L 27/092* (2006.01)
*H01L 29/417* (2006.01)

(56) References Cited

U.S. PATENT DOCUMENTS

| | | |
|---|---|---|
| 8,455,366 B1 | 6/2013 | Fuller et al. |
| 9,054,214 B1 | 6/2015 | Baldwin et al. |
| 9,324,710 B2 | 4/2016 | Leobandung |
| 9,331,074 B1 * | 5/2016 | Chang ................. H01L 27/0886 |
| 9,349,868 B1 | 5/2016 | Balakrishnan et al. |
| 9,601,567 B1 * | 3/2017 | Hsieh ................... H01L 29/785 |
| 10,043,712 B1 * | 8/2018 | Hsu ................. H01L 21/823437 |
| 10,263,090 B2 * | 4/2019 | Lin ................. H01L 21/823481 |
| 2015/0170971 A1 | 6/2015 | Baldwin et al. |
| 2017/0018437 A1 | 1/2017 | Greene et al. |
| 2017/0018628 A1 | 1/2017 | Greene et al. |
| 2017/0033000 A1 | 2/2017 | Greene et al. |

\* cited by examiner

FINFET GATE CUT AFTER DUMMY GATE REMOVAL

BACKGROUND

Technical Field

The present invention generally relates to semiconductor device fabrication and, more particularly, to fabrication of fin field effect transistors using gate-cut processes.

Description of the Related Art

To reduce the size of semiconductor device dimension beyond the dimensions that can be formed by photolithography processes, gates for transistors, in particular fin field effect transistors (FinFETs), may be formed using sidewall image transfer processes. However, sidewall image transfer processes do not provide the ability to directly control gate length at these size scales. As such, gates that are formed need to be cut so that they do not contact one another where such contact is not called for.

One existing process cuts the gate in a replacement metal gate hardmask, which has problems with the final gate etch taper leading to epitaxial defects. Another existing process cuts the dummy gate, which can have problems with maintaining vertical cut profiles in the tip-to-tip direction, while eliminating slivers in the orthogonal direction. Thus present fabrication techniques have poor profile control or the inability to be completely selective to non-cut materials, resulting in undesirable gate height loss.

SUMMARY

A semiconductor device includes a first semiconductor fin. A first gate stack is formed over the first semiconductor fin. Source and drain regions are formed on respective sides of the first gate stack. An interlayer dielectric is formed around the first gate stack. A gate cut plug is formed from a dielectric material at an end of the first gate stack.

A semiconductor device includes a first semiconductor fin. A first gate stack is formed over the first semiconductor fin. Source and drain regions are formed on respective sides of the first gate stack. An interlayer dielectric is formed around the first gate stack. A gate cut plug includes a first layer of dielectric material formed conformally on spacer sidewalls and a second layer of planarizing material that completely fills any space between the spacer sidewalls that is not filled by the first layer of dielectric material and is formed at an end of the first gate stack.

A semiconductor device includes a first semiconductor fin. A first gate stack is formed over the first semiconductor fin. Source and drain regions are formed on respective sides of the first gate stack. An interlayer dielectric is formed around the first gate stack. A gate cut plug includes first layer of silicon nitride formed conformally on spacer sidewalls and a second layer of silicon dioxide that completely fills any space between the spacer sidewalls that is not filled by the first layer of silicon nitride and is formed at an end of the first gate stack.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present principles perform a gate cut by creating a plug after the removal of a dummy gate and before the formation of a replacement gate. The plug prevents the replacement gate from being formed in the area in question, removing the need for a gate cut etch that might damage surrounding structures.

Figure 1:
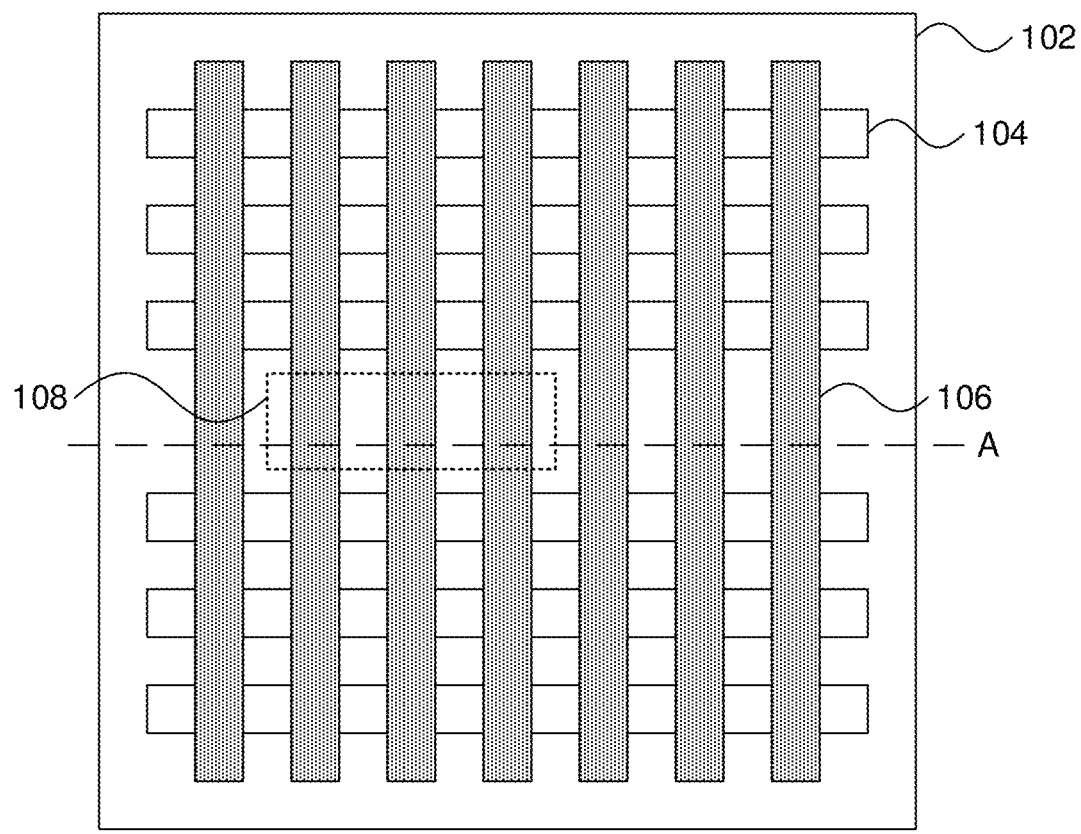
FIG. 1 is a top-down view of a step in the formation of fin field effect transistors (finFETs) using a gate cut process in accordance with an embodiment of the present invention.

Referring now to the drawings in which like numerals represent the same or similar elements and initially to FIG. 1, a top-down view of a step in the fabrication of fin field effect transistors (FinFETs) is shown. The top-down view identifies a cross section A, which will be used in subsequent figures to describe the structures shown and subsequent processing steps. A semiconductor substrate 102 is shown having semiconductor fins 104. Dummy gate structures 106 are formed over the fins 104. At this stage, it is specifically contemplated that the dummy gate structures 106 are formed from a selectively etchable material such as amorphous silicon. Source and drain regions (not shown) may be formed for at least one of the dummy gate structures. A gate cut region 108 is identified—the gate will be cut in this region in the final device.

The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

The fins 104 may be formed from the semiconductor substrate using, for example, photolithographic patterning and an anisotropic etch such as, e.g., reactive ion etching (RIE). RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Alternatively, the fins 104 can be formed by spacer imaging transfer, which is also known as sidewall image transfer. In sidewall image transfer processes, an initial sacrificial structure is formed at, for example, a smallest feature size that can be created using a given photolithographic technology. Spacer structures are then formed on sidewalls of the sacrificial structures using a conformal deposition process. These spacer structures can be made extremely thin (e.g., about 5 nm). The spacer structures are then used to pattern an underlying semiconductor layer (e.g., the semiconductor substrate 104) with an anisotropic etch, creating fins 104 having dimensions substantially smaller than the smallest feature size.

Figure 2:
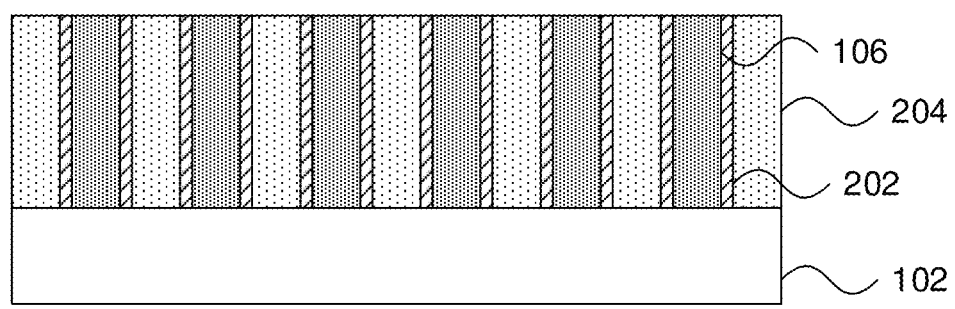
FIG. 2 is a cross-sectional view of a step in the formation of finFETs using a gate cut process that shows dummy gates in a gate cut region in accordance with an embodiment of the present invention.

Referring now to FIG. 2, a cross-sectional view of a step in the fabrication of finFETs is shown along cross-section A. In particular, the dummy gate structures 106 are shown in cross-section. In this view, gate spacers 202 and an interlayer dielectric 204 have been formed between the dummy gate structures 106. The gate cut area 108 is included in this cross-sectional view.

It should be understood that the gate spacers 202 and the interlayer dielectric 204 may, in one particular embodiment, be formed from silicon nitride and silicon dioxide respectively, but any appropriate dielectric materials (e.g., SiOCN, SiBCN, etc.) may be used instead.

Figure 3:
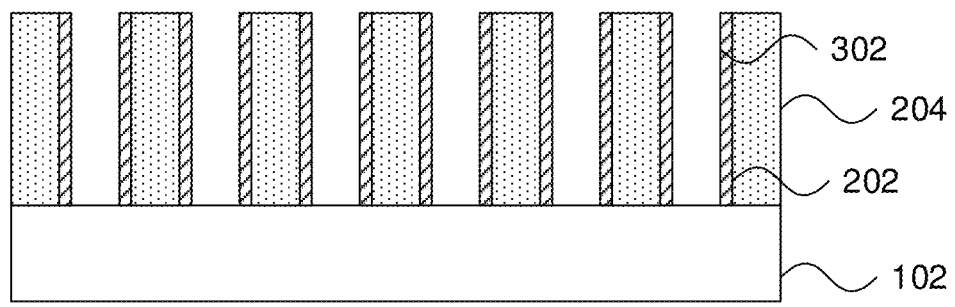
FIG. 3 is a cross-sectional view of a step in the formation of finFETs using a gate cut process that shows removal of the dummy gates in accordance with an embodiment of the present invention.

Referring now to FIG. 3, a cross-sectional view of a step in the fabrication of finFETs is shown along cross-section A. The dummy gate structures 106 are etched away by a selective etch that does not affect the gate spacers 202, the interlayer dielectric 204, or the underlying substrate 102 and fins 104. As used herein, the term "selective" in reference to a material removal process denotes that the rate of material removal for a first material is greater than the rate of removal for at least another material of the structure to which the material removal process is being applied. Thus the selective etch, which may be any appropriate wet or dry isotropic chemical etch or anisotropic etch, removes material from the dummy gate structures 106 selectively without damaging the surrounding structures. The etch leaves gate voids 302 between the gate spacers 202.

Figure 4:
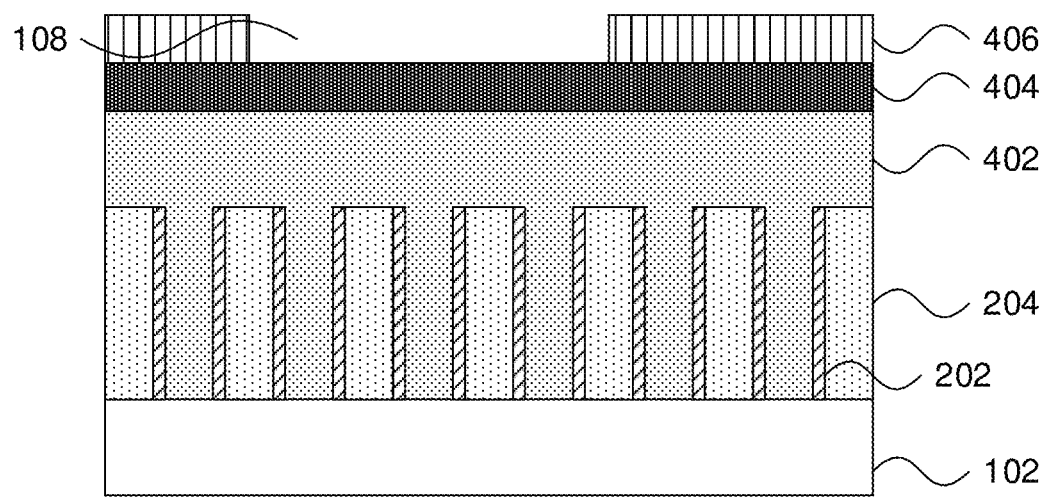
FIG. 4 is a cross-sectional view of a step in the formation of finFETs using a gate cut process that shows a resist mask defining a gate cut region in accordance with an embodiment of the present invention.

Referring now to FIG. 4, a cross-sectional view of a step in the fabrication of finFETs is shown along cross-section A. A gate cut photolithography stack is formed to define the gate cut region 108. An organic planarizing layer 402 is first filled in to fill the gate voids 302. An antireflective coating 404 is then formed over the organic planarizing layer. A resist layer 406 is then formed over the antireflective coating with a gap in the gate cut region 108 that leaves the underlying layers exposed. The organic planarizing layer 402 may be capable of withstanding the temperatures needed to form compatible dielectric materials (e.g., above about 300° C.).

In photolithographic processes, a pattern is produced by applying a photoresist material to the surface to be etched, exposing the photoresist material to a pattern of radiation, and then developing the pattern into the photoresist material utilizing a resist developer. Once the patterning of the photoresist is completed, the sections covered by the photoresist are protected from subsequent etching processes while the exposed regions are removed using a selective etching process that removes the unprotected regions.

Figure 5:
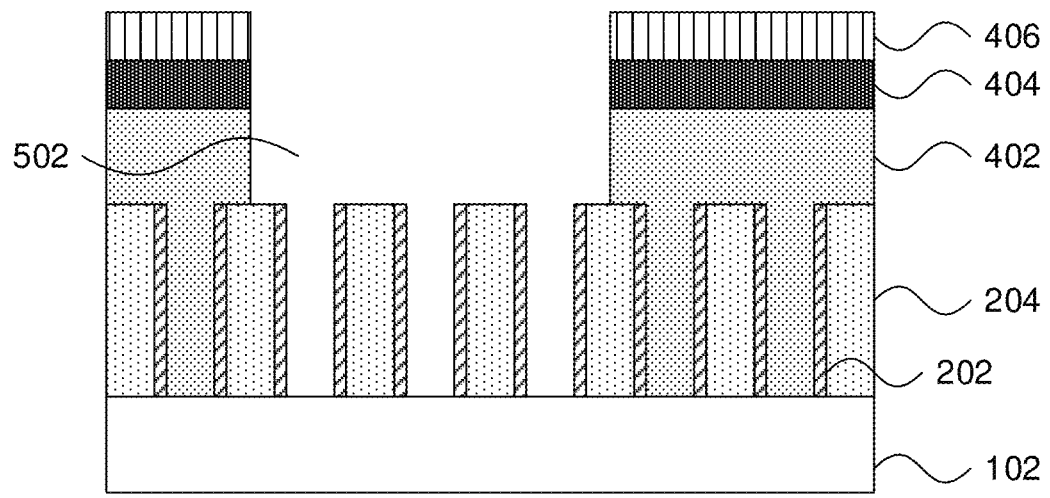
FIG. 5 is a cross-sectional view of a step in the formation of finFETs using a gate cut process that shows exposure of gate voids in the gate cut region in accordance with an embodiment of the present invention.

Referring now to FIG. 5, a cross-sectional view of a step in the fabrication of finFETs is shown along cross-section A. The antireflective coating 404 is first anisotropically etched to expose the organic planarizing layer 402 in the gate cut region 108. The exposed organic planarizing layer 402 is then anisotropically etched, leaving gate cut gap 502.

Figure 6:
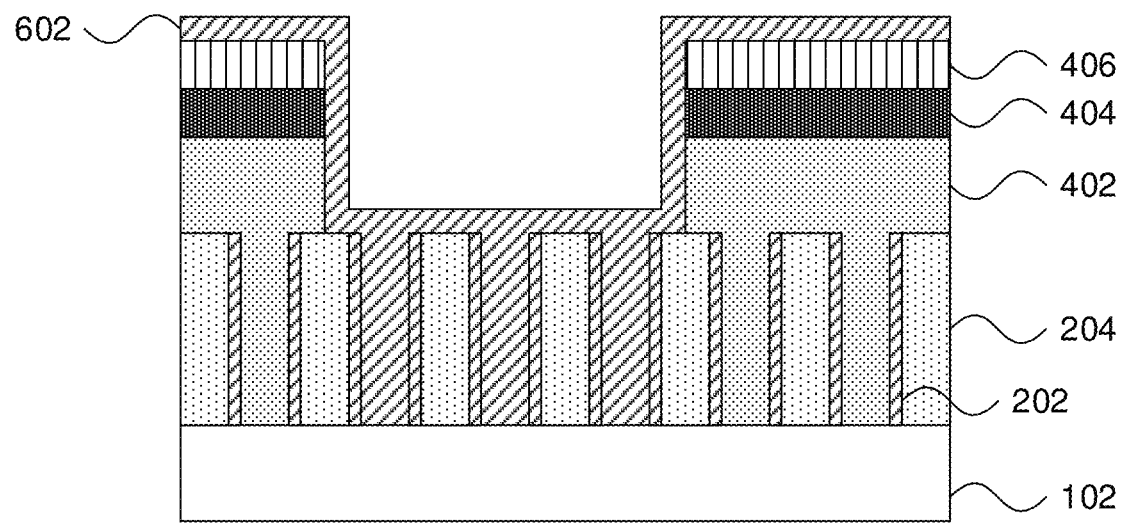
FIG. 6 is a cross-sectional view of a step in the formation of finFETs using a gate cut process that shows formation of the gate cut plug in accordance with an embodiment of the present invention.

Referring now to FIG. 6, a cross-sectional view of a step in the fabrication of finFETs is shown along cross-section A. A gate cut plug 602 is formed by conformally depositing a dielectric material in the gate cut gap 502. It is specifically contemplated that a nitride such as silicon nitride may be used, but any appropriate dielectric material may be used instead. In the embodiment shown in FIG. 6, the gate cut plug completely fills the spaces between gate spacers 202, but it should be understood that alternative embodiments may have a thinner layer of deposited dielectric material where the gate cut plug 602 does not fill these spaces.

Figure 7:
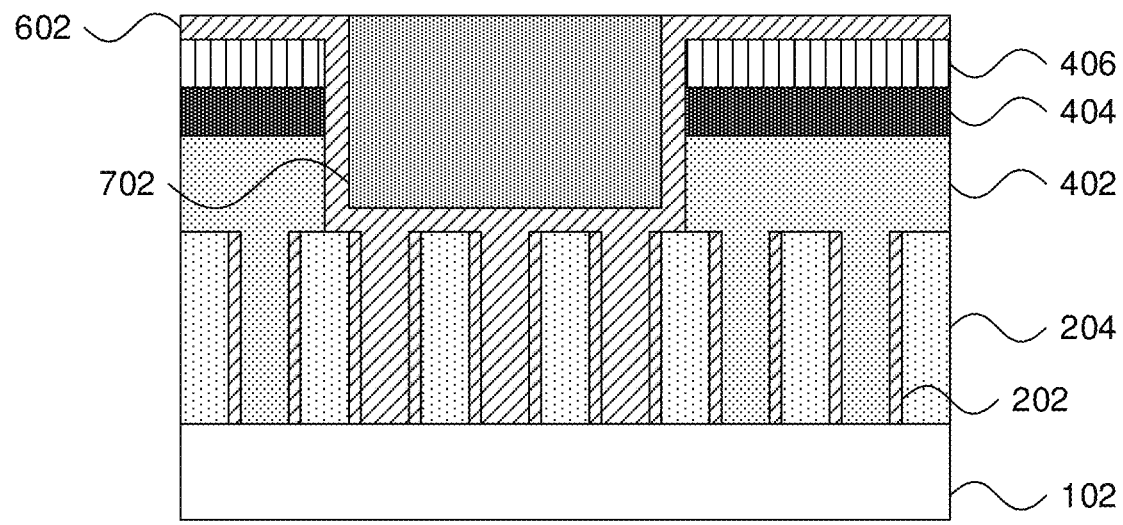
FIG. 7 is a cross-sectional view of a step in the formation of finFETs using a gate cut process that shows formation of a planarizing material in the gate cut region in accordance with an embodiment of the present invention.

Referring now to FIG. 7, a cross-sectional view of a step in the fabrication of finFETs is shown along cross-section A. A planarizing material 702 is deposited that fills the voids in the gate cut region 108 and that may be formed from any appropriate dielectric material including, e.g., silicon dioxide. In embodiments where a thin gate cut plug 602 is used, such that the gate cut plug 602 does not entirely fill the gaps between gate spacers 202, the planarizing material fills any remaining gaps. The planarizing material 702 is then polished down to the level of the gate cut plug 602 using, e.g., a chemical mechanical planarizing process (CMP) to create an even top surface.

CMP is performed using, e.g., a chemical or granular slurry and mechanical force to gradually remove upper layers of the device. The slurry may be formulated to be unable to dissolve, for example, the gate cut plug material, resulting in the CMP process's inability to proceed any farther than that layer.

Figure 8:
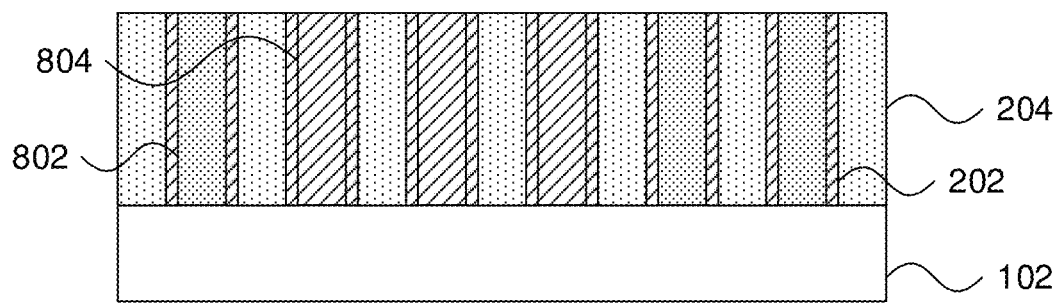
FIG. 8 is a cross-sectional view of a step in the formation of finFETs using a gate cut process that shows removal of material above the level of an interlayer dielectric in accordance with an embodiment of the present invention.

Referring now to FIG. 8, a cross-sectional view of a step in the fabrication of finFETs is shown along cross-section A. All layers are non-selectively etched down to at least the top level of the interlayer dielectric 204, though it should be understood that the etch may also etch down the interlayer dielectric 204. It is contemplated that a timed anisotropic etch or CMP process may be used. The remaining structure includes organic planarizing layer fins 802 and gate cut plug fins 804 (which may be formed entirely from the gate cut plug 602 or may include material from both the gate cut plug 602 and the planarizing material 702). Because of the manner of performing the gate cut, the gate cut plug 804 has a profile that is substantially vertical, in contrast to existing gate cut processes.

Figure 9:
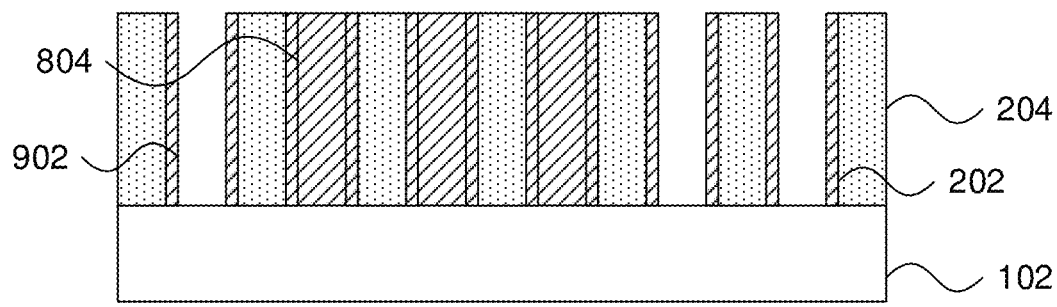
FIG. 9 is a cross-sectional view of a step in the formation of finFETs using a gate cut process that shows the removal of dummy gates outside the gate cut region in accordance with an embodiment of the present invention.

Referring now to FIG. 9, a cross-sectional view of a step in the fabrication of finFETs is shown along cross-section A. The remaining organic planarizing layer fins 802 are ashed away, leaving behind only inorganic materials. The result is that gate gaps 902 are left open while areas within the gate cut region 108 are plugged by the gate cut plug fins 804. This ashing process may include an etch in, for example, oxygen, formic gas, or nitrogen or hydrogen plasmas that removes organic materials selectively from inorganic materials.

Figure 10:
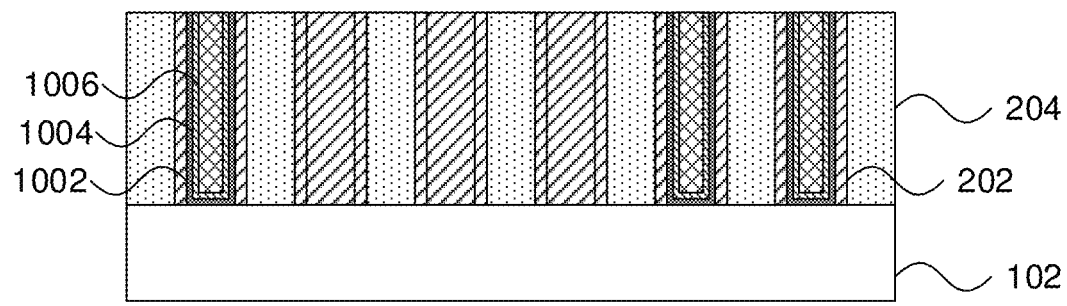
FIG. 10 is a cross-sectional view of a step in the formation of finFETs using a gate cut process that shows formation of a gate stack in accordance with an embodiment of the present invention.

Referring now to FIG. 10, a cross-sectional view of a step in the fabrication of finFETs is shown along cross-section A. At this stage, the gate gaps 902 may be filled by an appropriate gate stack that includes, e.g., a gate dielectric 1002, a work function metal layer 1004, and a replacement metal gate conductor 1006, though it should be understood that other materials may be used instead and that the work function metal layer 1004 may be omitted entirely.

Additional structures may be formed to provide electrical connectivity to the gate conductor 1006 as well as to source/drain regions (not shown). This finishes the device, creating finFETs in regions where a channel portion of a fin 104 lies underneath a particular gate stack and between a source region and a drain region.

It is specifically contemplated that the gate dielectric 1002 may be formed from a high-k dielectric material, though other dielectric materials may be used instead. A high-k dielectric material is defined herein as a material having a dielectric constant greater than that of silicon dioxide. Examples of high-k dielectric materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric material may further include dopants such as lanthanum and aluminum.

The work function metal layer 1004 may be a p-type work function metal layer or an n-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, a p-type work function metal layer may be formed from titanium nitride, titanium aluminum nitride, ruthenium, platinum, molybdenum, cobalt, and alloys and combinations thereof.

As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is formed from at least one of titanium aluminum, tantalum nitride, titanium nitride, hafnium nitride, hafnium silicon, or combinations thereof. It should be understood that titanium nitride may play the role of an n-type work function metal or a p-type work function metal, depending on the conditions of its deposition.

The gate conductor 1006 may be formed from any appropriate conductive metal such as, e.g., tungsten, nickel, titanium, molybdenum, tantalum, copper, platinum, silver, gold, ruthenium, iridium, rhenium, rhodium, and alloys thereof. The gate conductor 1006 may alternatively be formed from a doped semiconductor material such as, e.g., doped polysilicon.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 11:
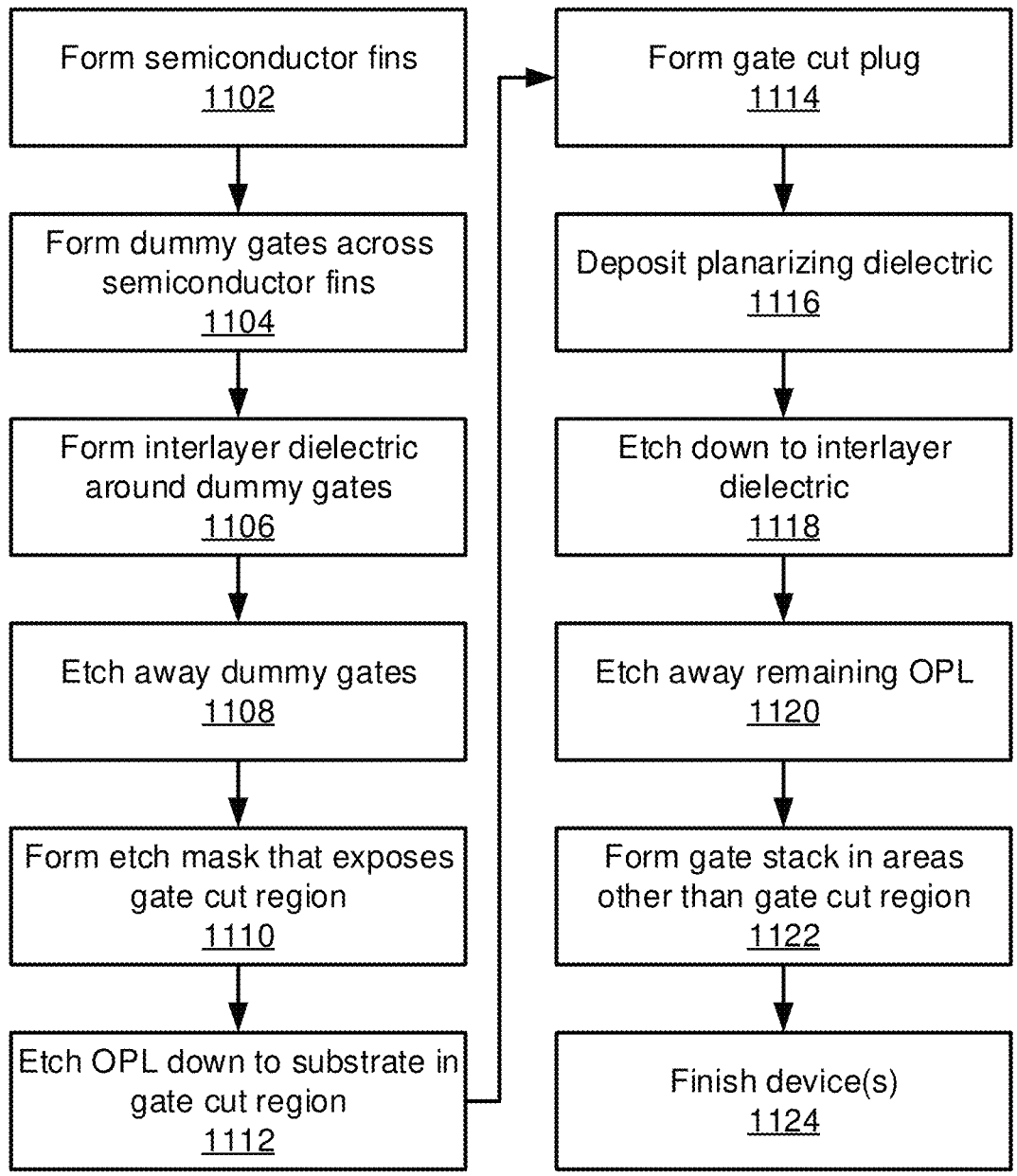
FIG. 11 is a block/flow diagram of a method of forming finFETs using a gate cut process in accordance with an embodiment of the present invention.

Referring now to FIG. 11, a method of forming finFETs is shown. Block 1102 forms the semiconductor fins 104. As noted above, the semiconductor fins 104 may be formed by etching down into a semiconductor substrate 102. It is specifically contemplated that the fins 104 may be formed by sidewall image transfer, which provides the ability to fabricate fin structures substantially thinner than what would otherwise be possible using photolithography. Block 1104 then forms dummy gates 106 across the semiconductor fins 1104. The dummy gates 106 may also be formed by sidewall image transfer or by any other appropriate means including, e.g., photolithography with an anisotropic etch. Block 1106 forms an interlayer dielectric 204 around and between the dummy gates 106, for example by spinning on a flowable silicon oxide and then polishing the resulting material down to the level of the dummy gates 106 using CMP. Block 1108 etches away the dummy gates 106 to produce gate voids 302.

Block 1110 forms an etch stack including an organic planarizing layer (OPL) 402, an anti-reflective coating 404, and a resist mask 406, where the resist mask 406 leaves the gate cut region 108 exposed. Block 1112 then etches down through the anti-reflective coating 404 and the organic planarizing layer 402 in the gate cut region 108 using one or more distinct anisotropic etches, exposing the substrate at the bottom of gate voids 302 in the area within the gate cut region 108.

Block 1114 forms the gate cut plug 602 by conformally depositing a dielectric material (e.g., silicon nitride) over the exposed surfaces. This gate cut plug 602 may have a thickness such that the gate voids 302 are completely filled or may, in other embodiments, have a thickness that leaves some of the gate voids 302 open. Block 1116 then forms a planarizing dielectric 702 in any gaps that remain, with a CMP process planarizing the top surfaces of the exposed layers. Block 1118 etches down to the interlayer dielectric 204 using, for example, a timed wet or dry chemical etch.

Block 1120 ashes away any remaining organic planarizing material to expose the gate voids 302 outside of the gate cut region 108. Block 1122 forms a gate stack in the exposed gate voids 302 from successive depositions of, e.g., gate dielectric layer 1002, work function metal layer 1004, and gate conductor 1006. Block 1124 then finishes the device by forming source/drain regions (these structures may be formed at any step in the process) and electrical contacts.

Having described preferred embodiments of finFET gate cut after dummy gate removal (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
a first semiconductor fin;
a first gate stack formed over the first semiconductor fin;
source and drain regions formed on respective sides of the first gate stack;
an interlayer dielectric formed around the first gate stack; and
a gate cut plug, formed from a dielectric material at an end of the first gate stack, comprising a first layer of dielectric material and a second layer of planarizing material.

2. The semiconductor device of claim 1, wherein the gate cut plug has a vertical profile.

3. The semiconductor device of claim 1, further comprising a second semiconductor fin parallel to the first semiconductor fin.

4. The semiconductor device of claim 1, further comprising a second gate stack formed over the second semiconductor fin and in line with the first gate stack.

5. The semiconductor device of claim 4, wherein the gate cut plug completely fills a space between the first gate stack and the second gate stack.

6. The semiconductor device of claim 1, wherein the first layer of dielectric material is formed conformally on spacer sidewalls but does not fill the space between the spacer sidewalls.

7. The semiconductor device of claim 6, wherein the second layer of planarizing material completely fills any space between the spacer sidewalls that is not filled by the first layer of dielectric material.

8. The semiconductor device of claim 7, wherein the first layer of dielectric material is formed from silicon nitride and wherein the second layer of planarizing material is formed from silicon dioxide.

9. A semiconductor device, comprising:
a first semiconductor fin;
a first gate stack formed over the first semiconductor fin;
source and drain regions formed on respective sides of the first gate stack;
an interlayer dielectric formed around the first gate stack; and
a gate cut plug, comprising a first layer of dielectric material formed conformally on spacer sidewalls and a second layer of planarizing material that completely fills any space between the spacer sidewalls that is not filled by the first layer of dielectric material, at an end of the first gate stack.

10. The semiconductor device of claim 9, wherein the gate cut plug has a vertical profile.

11. The semiconductor device of claim 9, further comprising a second semiconductor fin parallel to the first semiconductor fin.

12. The semiconductor device of claim 9, further comprising a second gate stack formed over the second semiconductor fin and in line with the first gate stack.

13. The semiconductor device of claim 12, wherein the gate cut plug completely fills a space between the first gate stack and the second gate stack.

14. The semiconductor device of claim 9, wherein the first layer of dielectric material is formed from silicon nitride and wherein the second layer of planarizing material is formed from silicon dioxide.

15. A semiconductor device, comprising:
a first semiconductor fin;
a first gate stack formed over the first semiconductor fin;
source and drain regions formed on respective sides of the first gate stack;
an interlayer dielectric formed around the first gate stack; and
a gate cut plug, comprising a first layer of silicon nitride formed conformally on spacer sidewalls and a second layer of silicon dioxide that completely fills any space between the spacer sidewalls that is not filled by the first layer of silicon nitride, at an end of the first gate stack.

16. The semiconductor device of claim 15, wherein the gate cut plug has a vertical profile.

17. The semiconductor device of claim 15, further comprising a second semiconductor fin parallel to the first semiconductor fin.

18. The semiconductor device of claim 15, further comprising a second gate stack formed over the second semiconductor fin and in line with the first gate stack.

19. The semiconductor device of claim 18, wherein the gate cut plug completely fills a space between the first gate stack and the second gate stack.

* * * * *